(12) United States Patent
Schanzenbach

(10) Patent No.: US 10,202,979 B2
(45) Date of Patent: Feb. 12, 2019

(54) FAN AND ARRANGEMENT HAVING SUCH A FAN

(71) Applicant: STEGO-HOLDING GMBH, Schwaebisch Hall (DE)

(72) Inventor: Bernd Armin Schanzenbach, Mainhardt Geisselhardt (DE)

(73) Assignee: STEGO-HOLDING GmbH, Schwaebisch Hall (DE)

( * ) Notice: Subject to any disclaimer, the term of this patent is extended or adjusted under 35 U.S.C. 154(b) by 658 days.

(21) Appl. No.: 14/377,371

(22) PCT Filed: Feb. 7, 2013

(86) PCT No.: PCT/EP2013/000370
§ 371 (c)(1),
(2) Date: Aug. 7, 2014

(87) PCT Pub. No.: WO2013/117338
PCT Pub. Date: Aug. 15, 2013

(65) Prior Publication Data
US 2015/0016990 A1    Jan. 15, 2015

(30) Foreign Application Priority Data

Feb. 7, 2012    (DE) .................. 10 2012 100 974

(51) Int. Cl.
*F04D 29/60*    (2006.01)
*F04D 19/00*    (2006.01)
(Continued)

(52) U.S. Cl.
CPC ........... *F04D 19/002* (2013.01); *F04D 25/08* (2013.01); *F04D 29/601* (2013.01); *H02B 1/052* (2013.01); *H02B 1/565* (2013.01)

(58) Field of Classification Search
CPC ....... F04D 29/64; F04D 29/646; H05K 7/103; H05K 7/1046
See application file for complete search history.

(56) References Cited

U.S. PATENT DOCUMENTS

D338,542 S    8/1993 Yuen
5,333,787 A    8/1994 Smith et al.
(Continued)

FOREIGN PATENT DOCUMENTS

CN    2477877 Y    2/2002
DE    29517962    1/1996
(Continued)

OTHER PUBLICATIONS

Chinese Office Action dated Aug. 5, 2015, Application No. 201380007930.3, 8 pages. (No English Translation).
(Continued)

*Primary Examiner* — David E Sosnowski
*Assistant Examiner* — Juan G Flores
(74) *Attorney, Agent, or Firm* — Hassan Abbas Shakir; Shakir Law PLLC

(57) ABSTRACT

A fan with a nozzle mounted to a base plate, wherein the base plate has on its rear wall a mounting device with an upper and lower holding device for mounting the fan on a top-hat rail. The upper holding device and the lower holding device reach over an upper edge or a lower edge respectively of the top-hat rail in the mounted state and are arranged offset from one another in a direction running parallel to the longitudinal axis of the top-hat rail in the mounted state of the fan.

20 Claims, 5 Drawing Sheets

Figure 1:
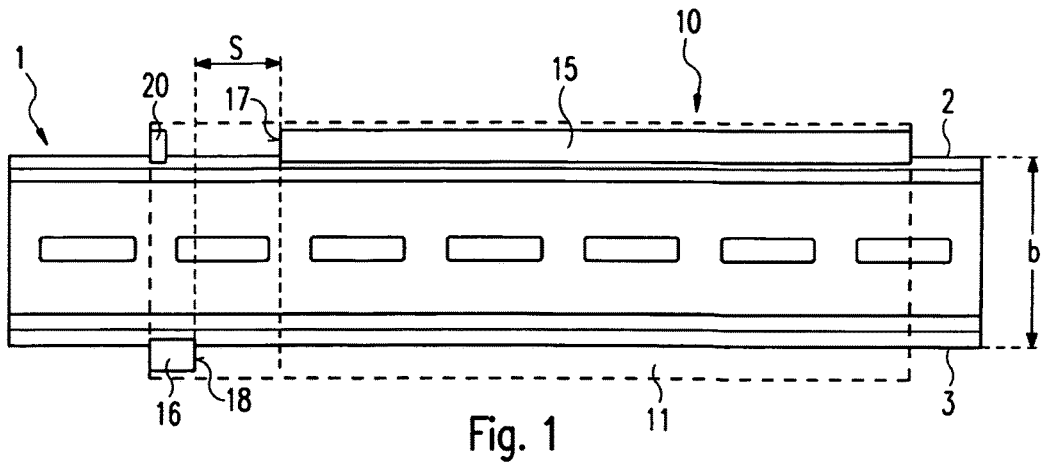

(51) Int. Cl.
*F04D 25/08* (2006.01)
*H02B 1/052* (2006.01)
*H02B 1/56* (2006.01)

(56) References Cited

U.S. PATENT DOCUMENTS

| | | | |
|---|---|---|---|
| 5,473,824 | A | 12/1995 | Prehodka |
| 5,522,704 | A | 6/1996 | Casteel |
| D375,348 | S | 11/1996 | Varrigan |
| 5,640,781 | A | 6/1997 | Carson |
| 5,839,204 | A | 11/1998 | Cinque et al. |
| D538,922 | S | 3/2007 | Graham |
| D570,981 | S | 6/2008 | McClelland |
| D610,244 | S | 2/2010 | Gabbara |
| 7,980,902 | B2 * | 7/2011 | Capaldi-Tallon .... H01R 9/2608 439/532 |
| 8,037,619 | B2 | 10/2011 | Liu |
| D670,146 | S | 11/2012 | Coley |
| 8,434,238 | B2 | 5/2013 | Gross et al. |
| D692,111 | S | 10/2013 | Wagner et al. |
| 2004/0216739 | A1 | 11/2004 | Fini |
| 2005/0092888 | A1 * | 5/2005 | Gonce ................... F04D 25/088 248/324 |
| 2005/0159101 | A1 * | 7/2005 | Hrdina .................. F24F 7/025 454/356 |
| 2008/0045135 | A1 | 2/2008 | Pfannenberg |
| 2010/0035464 | A1 * | 2/2010 | Capaldi-Tallon .... H01R 9/2608 439/532 |

FOREIGN PATENT DOCUMENTS

| | | |
|---|---|---|
| DE | 102007015470 | 10/2008 |
| DE | 102009014654 A1 | 9/2010 |
| DE | 102010061555 | 4/2012 |
| EM | 002233734-0001 | 5/2013 |
| EP | 1542324 | 6/2005 |
| EP | 2118968 | 12/2010 |
| JP | 07162167 | 6/1995 |
| JP | 7162167 A | 6/1995 |
| JP | 2003283163 A | 10/2003 |
| JP | 2008177597 | 7/2008 |
| JP | 2008177597 A | 7/2008 |
| JP | 2009290018 | 12/2009 |
| JP | 2009290018 A * | 12/2009 |
| RU | 2342567 C1 | 12/2008 |
| SE | 1996/0630 | 5/1997 |
| WO | 2010/100451 A1 | 9/2010 |
| WO | 2010100451 | 9/2010 |

OTHER PUBLICATIONS

International Preliminary Report on Patentability for application No. PCT/EP2013/000370, English translation attached to origianl, Both completed by the European Patent Office, Both dated Aug. 12, 2014, All together 7 Pages.
Written Opinion for application No. PCT/EP2013/000370, English translation attached to original, Both completed by the European Patent Office, Both dated Apr. 11, 2013, All together 13 Pages.
German Examination Report for Application No. 102012100974.0, dated Aug. 8, 2012, 6 Pages.
International Search Report for PCT/EP2013/000370, English translation attached to original, Both completed by the European Patent Office dated Apr. 18, 2013, All together 7 Pages.
Russian Notice of Allowance dated Nov. 15, 2016, Application No. 2014136187, 7 pages. (No English Translation).
Office Action dated Oct. 17, 2017 issued by the European Patent Office in parallel European Patent Application No. 13 704 716.3; partial machine translation provided; all references cited except DE 10 2009 014 654 A1 previously disclosed.

* cited by examiner

FAN AND ARRANGEMENT HAVING SUCH A FAN

CROSS-REFERENCE TO RELATED APPLICATION

This application is the U.S. national phase of PCT Application No. PCT/EP2013/00370 filed on Feb. 07, 2013, which claims priority to German Patent Application No. 10 2012 100 974.0 filed on Feb. 07, 2012, the disclosures of which are incorporated in their entirety by reference herein.

The invention relates to a fan and to an arrangement having such a fan. The fan is usually fastened, for example in a switch cabinet, by means of a top-hat rail. A fastening device suitable for a top-hat rail is described in conjunction with modular apparatuses in DE 10 2007 015 470 A1.

In the case of said fastening device, an upper and a lower retaining device are provided on a rear wall of an apparatus. For the purpose of fastening the apparatus on the top-hat rail, the apparatus is tilted upward, the upper retaining device is fitted into the upper periphery of the top-hat rail and the apparatus is then titled downward again, wherein the lower retaining device passes into releasable snap-fit engagement with the lower periphery of the top-hat rail. For the purpose of demounting the apparatus, the lower retaining device is released and the apparatus can be tilted upward and removed.

When an apparatus, e.g. a ventilating, heating or lighting device, has a very large installation depth and the amount of installation space above the top-hat rail is small, there are difficulties in fastening the apparatus on the top-hat rail since an upward-tilting operation is possible only to a limited extent. Furthermore, in the case of the known fastening device, the apparatus must have only a limited installation height; otherwise, the rear wall has to be of oblique design in order to achieve the necessary tilting angle. This reduces the amount of installation space within the apparatus.

It is an object of the invention to specify a fan which requires only a small amount of installation space for installation/removal purposes. The intention is also to specify an arrangement having such a fan. This object is achieved, for the fan, by the subject matter of claim 1 and, for the arrangement, by the subject matter of claim 11.

In particular, this object is achieved by a fan with a nozzle which is fastened on a base plate, wherein the base plate, on its rear wall, has a fastening device with at least one upper retaining device and at least one lower retaining device for fastening the fan on a top-hat rail. The upper retaining device and the lower retaining device, in the fastened state, engage around an upper periphery and a lower periphery, respectively, of the top-hat rail. The two retaining devices are offset in relation to one another, to be precise in a direction which, in the fastened state of the fan, runs parallel to the longitudinal axis of the top-hat rail. Those ends of the retaining devices which are directed toward one another in this direction form inner ends, wherein the inner end of the upper retaining device and the inner end of the lower retaining device are spaced apart by a distance of a width which is greater than the distance between the upper periphery and the lower periphery of the top-hat rail, and therefore the fan can be inserted into the top-hat rail by being tilted in a direction of tilting insertion about a tilting axis perpendicular to a longitudinal direction of the top-hat rail.

It is therefore the case that the hitherto known "upward-tilting operation" is modified into the fan being tilted or rotated about a tilting axis, which is located parallel to the longitudinal axis of the fan or coincides therewith. On the one hand, this makes it possible for the rear wall of the fan, even in the case of a relatively large installation height, to be completely straight, that is to say without the otherwise necessary beveling. On the other hand, this different type of fitting-in movement means that the amount of free space necessary above the top-hat rail or the fan is considerably smaller, even in the case of a very large fan depth, than was the case up until now.

When the center of gravity of the fan is located relatively to the tilting axis such that the fan, in the fastened state, is tilted in the fastening direction, the fan can be fitted in and fastened reliably on the top-hat rail without any additional locking catch being required. In order to improve reliability, however, a locking catch is preferably provided, and this locks the fan against tilting in the fastened state.

The locking catch is preferably designed such that it can be unlocked upon insertion of the fan by the latter being tilted in the direction of tilting insertion. It thus snap-fits in without separate actuation being required.

In the case of a preferred embodiment of the invention, the upper and the lower retaining devices have bevels which are directed toward one another and are intended for reducing the tilting angle which is necessary for insertion purposes.

The upper and the lower retaining devices may be of different length, wherein the upper retaining device is preferably longer than the lower retaining device. It is preferable, however, for the two retaining devices to be designed to be essentially rotationally symmetrical about the tilting axis.

The design is particularly straightforward when the retaining devices are formed in one piece with a rear wall of the fan or with the entire housing of the fan, in particular from plastic, preferably by being injection-molded.

The fastening device may have a plurality of upper retaining devices and a plurality of lower retaining devices, wherein the upper and the lower retaining devices are oriented differently and interact in pairs for fastening the fan on the top-hat rail such that the fan can be installed in different positions, for example in positions which are offset by 90° in relation to one another. The advantage here is that the fan, depending on the different requirements which have to be met by its positioning, can be flexibly installed in a technically straightforward manner. A further advantage is that installation in different positions, in particular in positions which are offset by 90° in relation to one another, renders the connection of the fan variable.

In a further embodiment, the fan comprises a one-dimensional pivoting element for pivoting the fan about a pivot axis. As a result, the direction of the air passing out through the nozzle can be adjusted in a technically straightforward manner.

It may be that the fan can be installed in such positions that the pivot axis runs essentially parallel, or essentially perpendicularly, to the longitudinal axis of the top-hat rail. This ensures a high degree of freedom for the discharge direction of the air through the nozzle of the fan. If the fan, in addition, has a rotatable air-discharge grille, it is thus possible to adjust any direction for the discharge direction of the air. By virtue of it being possible to install the fan in two positions which are offset by 90° in relation to one another, just one one-dimensional pivoting element is required in order to achieve a high or maximum degree of freedom for the discharge direction of the air. A one-dimensional pivoting element, which can be pivoted in a single plane, has the advantage, in particular in relation to a two-dimensional pivoting element, of being cost-effective and stable. At the same time, the combination of installation capability in two positions which are offset by 90° in relation to one another, of pivoting capability or rotary capability about a pivot axis and possibly the rotary capability of the discharge grille give rise to a high or maximum degree of freedom for the adjustability of the discharge direction. In particular, the fan with a one-dimensional pivoting element is stable in relation to vibration forces and/or, in the case of vibration forces occurring, is more stable than a two-dimensional rotary element or pivoting element, in particular when, in the case of a two-dimensional rotary element or pivoting element, the second axis of rotation or pivot axis is further away from the top-hat rail, that is to say the point of suspension of the fan.

In a further embodiment, the retaining devices and/or the bevels are adapted to the material thickness of the top-hat rail and/or the depth of the top-hat rail. The advantage here is that the fan can be fastened in a technically straightforward and reliable manner on appropriately designed top-hat rails.

The combination of fan and top-hat rail is disclosed and claimed within the context of the arrangement having such a fan and a top-hat rail. The fan here is connected, in particular connected in a releasable manner, to the top-hat rail by the fastening device.

Figure 2:
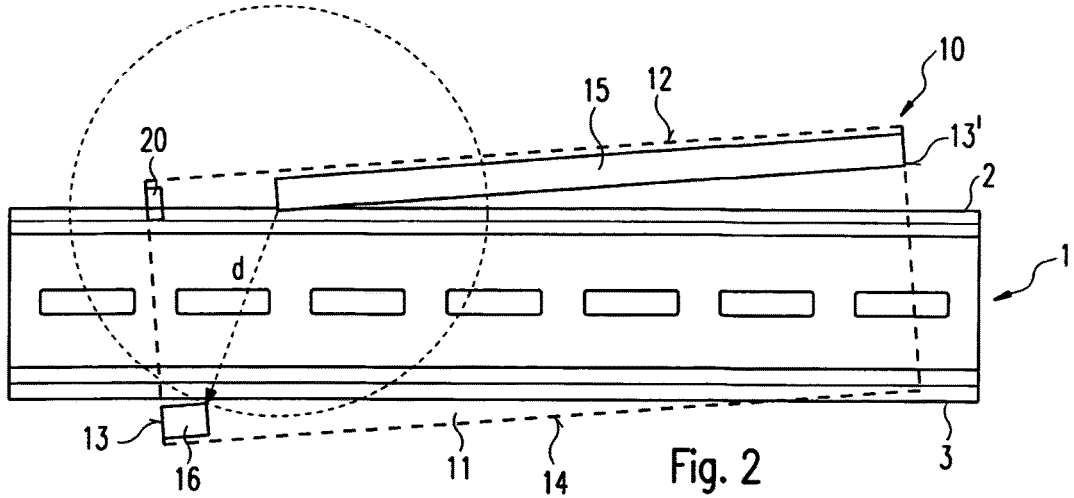
Figure 3:
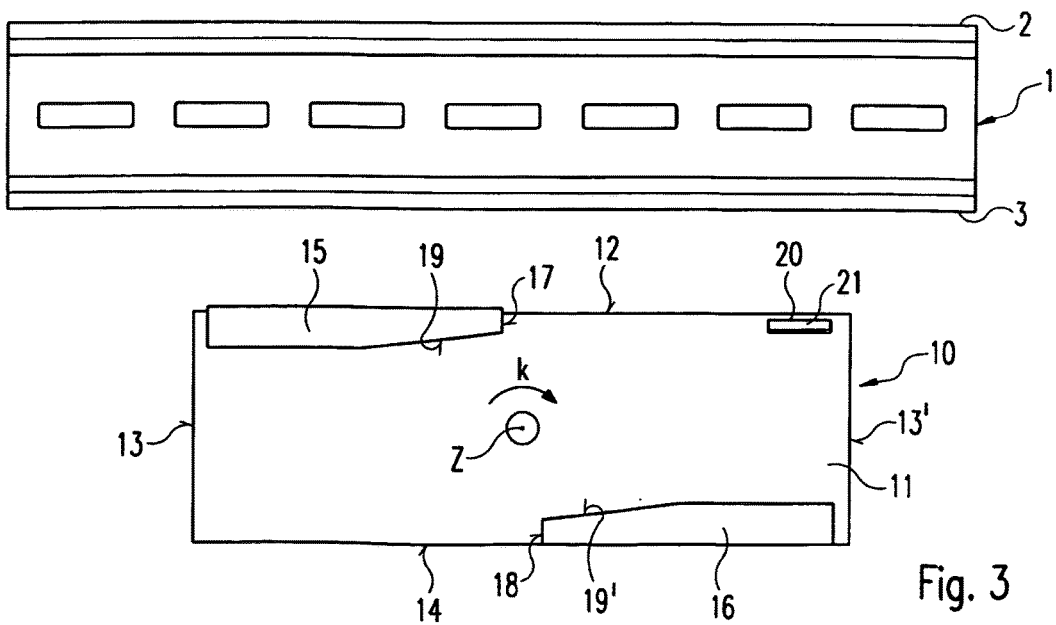
Figure 4:
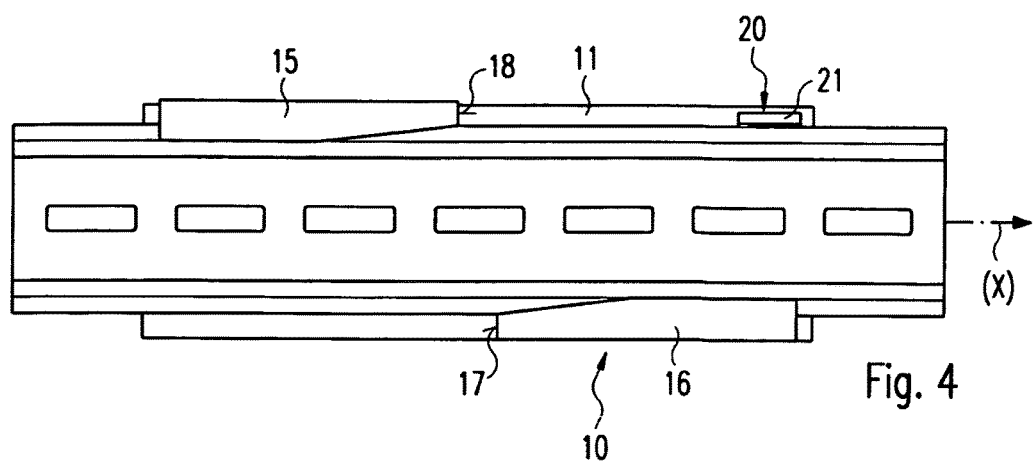
Figure 5:
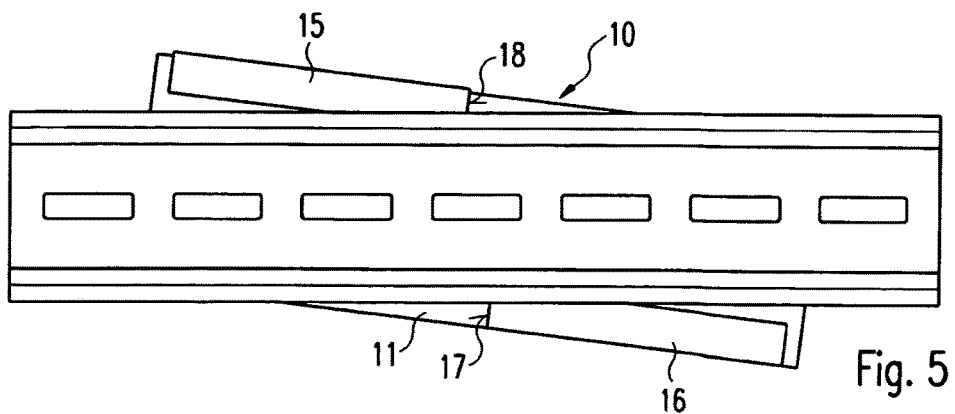
Figure 6:
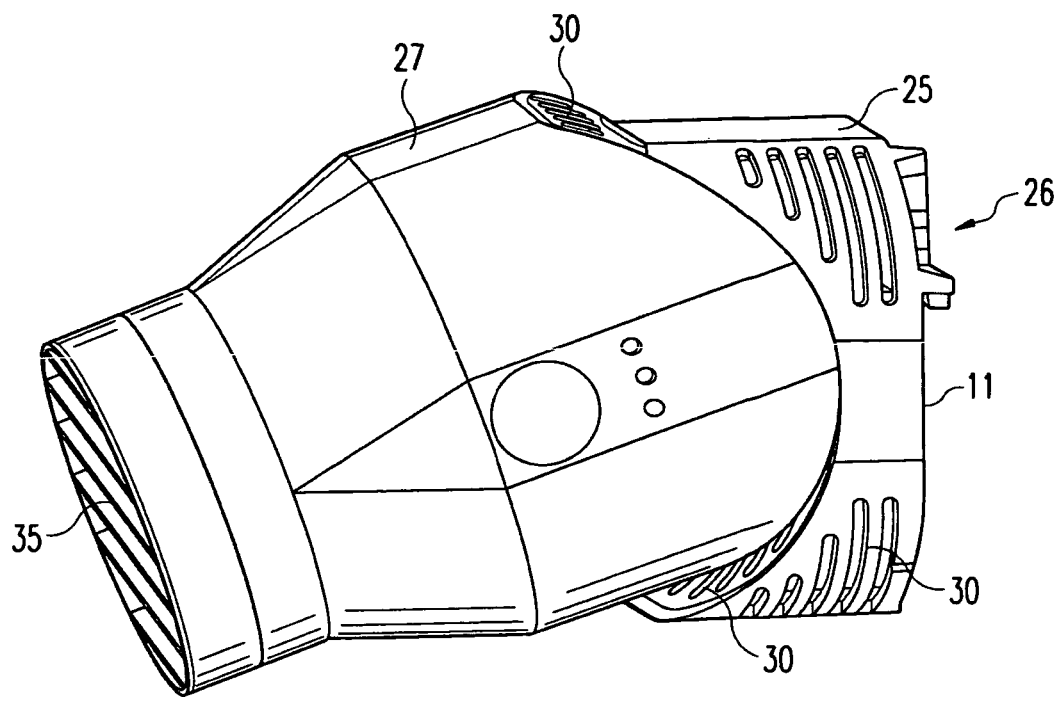
Figure 7:
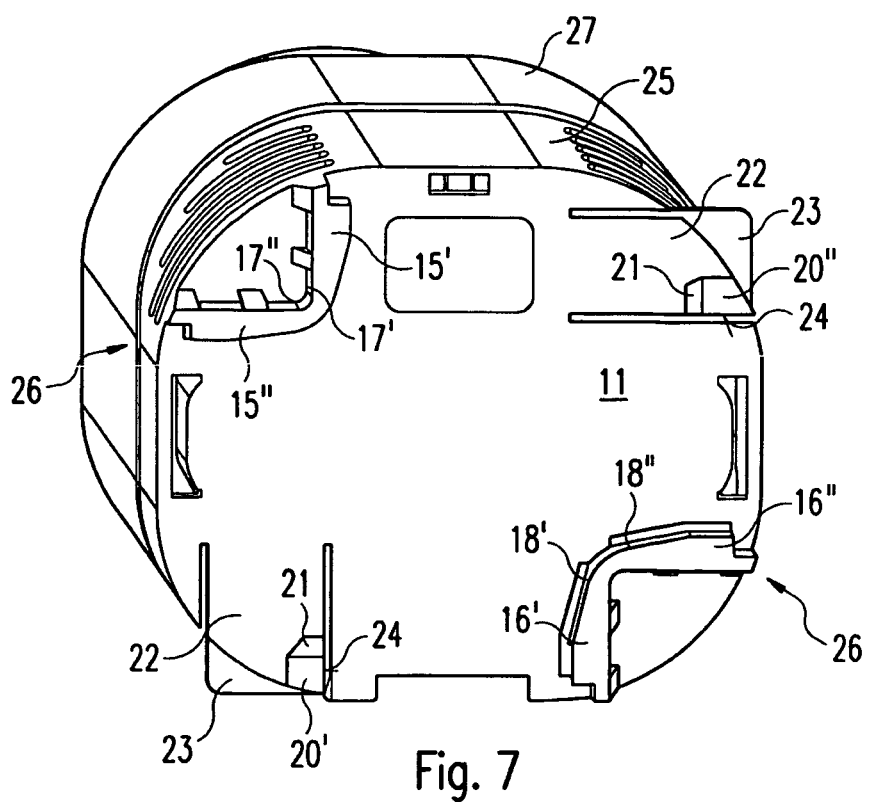
Figure 8A:
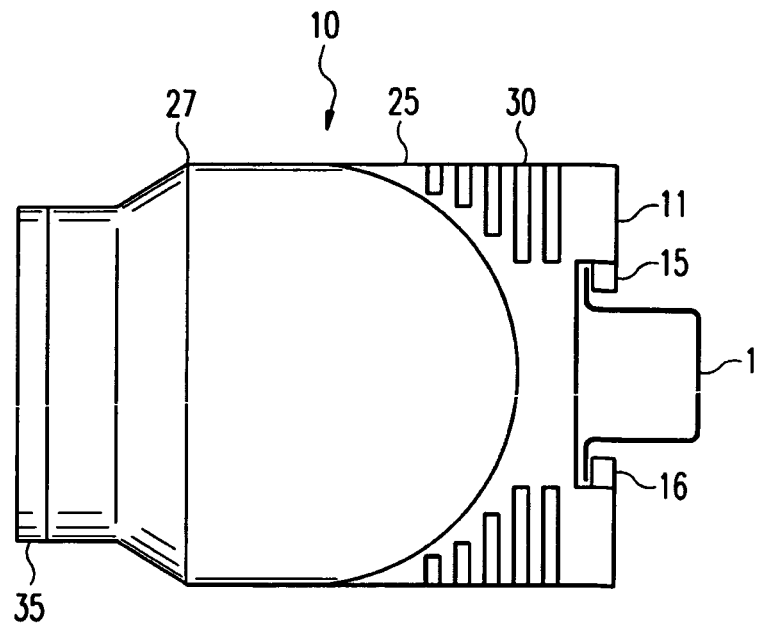
Figure 8B:
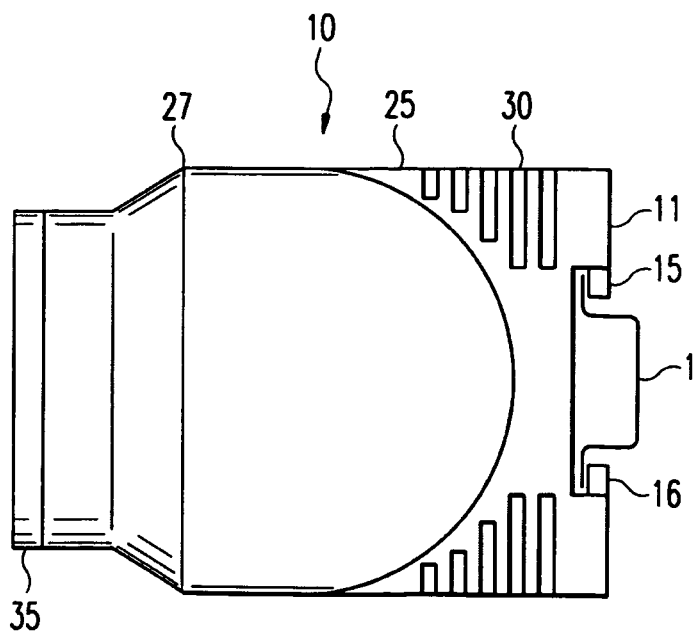

Preferred embodiments of the invention will be explained in more detail hereinbelow with reference to the figures, in which:

FIG. 1 shows a first embodiment of a fastening device provided for the fan according to the invention, said fastening device embodiment being viewed from the rear in the fastening state, FIG. 2 shows the embodiment according to FIG. 1 during insertion, FIG. 3 shows a top-hat rail and a second embodiment of a fastening device provided for the fan according to the invention, said fastening device being viewed from the rear, FIG. 4 shows the arrangement according to FIG. 3 when fastening has taken place, FIG. 5 shows a view similar to that according to FIG. 4, but in a state during insertion, FIG. 6 shows a perspective side view of an embodiment of the fan according to the invention, FIG. 7 shows a rear view of the fan according to FIG. 6, and FIGS. 8A and 8B show schematic side views of different kinds of top-hat rails on which embodiments of the fan according to the invention are, or can be, fastened.

The following description uses the same designations for like and equivalent parts.

FIG. 1 illustrates schematically a top-hat rail 1 with its upper periphery 2 and its lower periphery 3, to be precise in a view from the rear, that is to say from the side by which the top-hat rail 1 is installed in a switch box or the like.

The operation of fastening the fan 10 on the top-hat rail 1 is explained hereinbelow in general terms in conjunction with an apparatus 10 or body. The design features of the fastening device 26 and the functioning thereof are disclosed and claimed in conjunction with a fan, in particular with a fan which has a nozzle. A specific exemplary embodiment of such a fan is disclosed in FIGS. 6 and 7.

The top-hat rail 1 has fastened on it, in this illustration, an apparatus 10 or a body, on the rear wall 11 of which are fastened an upper retaining device 15 and a lower retaining device 16, these being of essentially L-shaped configuration, and therefore they can engage around the upper periphery 2 and the lower periphery 3, respectively, of the top-hat rail 1. An inner end 17 of the upper retaining device 15 and an inner end 18 of the lower retaining device 16 are spaced apart from one another by a distance S. Also provided is a locking catch 20, which is designed for snap-fitting in over the upper periphery 2 of the top-hat rail 1, as will be described in more detail at a later stage in the text.

As shown in FIG. 2, the distance S results in a gap between the inner end 17 of the upper retaining device 15 and the inner end 18 of the lower retaining device 16, said gap being designated d in FIG. 2. If the body 10 is then tilted, as shown in FIG. 2, in the counterclockwise direction, the body 10 can be clipped, by way of its upper retaining device 15 and the lower retaining device 16 onto the top-hat rail 1, the width b of which (see FIG. 1) is smaller than said distance d. If the body 10 is then tilted back into the horizontal position again (as shown in FIG. 1), the locking catch 20 snap-fits in and projects beyond the upper periphery 2 of the top-hat rail 1 such that it is no longer possible for the body to be tilted in order to be removed from the top-hat rail 1.

In general terms, the upper and the lower retaining devices 15, 16 are offset in relation to one another in a direction which, in the fastened state of the apparatus or body 10, runs parallel to the longitudinal axis of the top-hat rail 1, wherein those ends of the retaining devices which are directed toward one another in this direction form the inner ends 17, 18. This feature is disclosed and claimed in conjunction with all the exemplary embodiments.

The arrangement shown in FIGS. 1 and 2 should illustrate that the important factor predominantly is correct dimensioning of the distance S in relation to the width b of the top-hat rail in order to achieve insertion in the manner indicated here.

In the case of the embodiment described hereinbelow, the upper retaining device 15 and the lower retaining device 16 are designed to be rotationally symmetrical about an axis Z, which is located in the center of the rear wall 11 of the body 10. This embodiment of the invention also differs in that the upper retaining device 15 and the lower retaining device 16 each have bevels 19, 19'. As a result, the distance between the inner end 17 of the upper retaining device 15 and the inner end 18 of the lower retaining device 16 is increased in relation to the embodiment shown above, and therefore the angle of rotation through which the body 10 has to be rotated for insertion purposes is smaller. The position of the body 10 fastened on the top-hat rail 1 is shown in FIG. 4; the position in which the body 10 is being fastened on the top-hat rail 1 is shown in FIG. 5. The function of the bevels 19, 19' can also be seen to very good effect from these figures.

FIGS. 6 and 7 show an exemplary embodiment of a fan 10 which has a fastening device 26 for fastening on a top-hat rail 1. The design features and functions of the fastening device described in conjunction with FIGS. 1-5 are also disclosed in conjunction with the fan according to FIGS. 6 and 7.

The fan 10 has a nozzle 27. The nozzle 27 is a movable nozzle, by means of which the direction of the air stream which passes out of the fan nozzle 27 can be deflected. The nozzle 27 can be pivoted about an axis which, in the fastened state, runs parallel to the longitudinal axis of the top-hat rail 1 (not illustrated). The nozzle 27 is fastened on a base plate 25. The nozzle 27 and the base plate 25 are connected by a one-dimensional pivoting element or pivoting articulation which is known per se (not illustrated). A one-dimensional pivoting element can be pivoted in a single pivoting plane.

The convexly curved rear wall of the nozzle 27 is accommodated in a correspondingly concavely curved front wall of the base plate 25. The side walls of the base plate 25 have air slots 30. Further air slots are provided in the front wall of the base plate 25 and in the rear wall of the nozzle 27. Components which are known per se can be used for the nozzle 27 and the base plate 25, wherein the rear wall of the base plate 25 has a fastening device 26 which allows the base plate 25 to be connected to a top-hat rail 1 by way of a lateral tilting movement. For this purpose, the fastening device 26, as can best be seen in FIG. 7, has upper and lower retaining devices 15', 15" and 16', 16". The construction of the retaining devices 15', 15" and 16', 16" corresponds essentially to the construction of the retaining device according to FIGS. 1-5, to which reference is explicitly made here.

In order for it to be possible to fasten the fan in two different positions on the top-hat rail 1, a plurality of upper retaining devices 15', 15" and a plurality of lower retaining devices 16', 16" are provided, these being oriented differently in each case, i.e. the upper retaining devices 15', 15" have different longitudinal directions. The lower retaining devices 16', 16" likewise have different longitudinal directions. Upper and lower retaining devices 15', 15" and 16', 16" which are oriented parallel in the same longitudinal direction each form a retaining pair for fastening the fan 10 on the top-hat rail 1. The different installation positions of the fan 10 are achieved from the different orientations of the retaining pairs.

In specific terms, the fan 10 according to FIGS. 6 and 7 have two upper retaining devices 15', 15" and two lower retaining devices 16', 16". In each case an upper retaining devices 15', 15" and a lower retaining device 16' and 16" interact in pairs for fastening the fan 10 on the top-hat rail 1. In the example according to FIG. 6, the two upper retaining devices 15', 15" are oriented at an angle of 90° in relation to one another. The same applies to the two lower retaining devices 16', 16". This gives rise to two installation positions, each rotated through 90°, for the fan. Other angles of orientation between the two upper retaining devices 15', 15" and the two lower retaining devices 16', 16" are possible. This gives rise to correspondingly different installation positions. The angles of orientation of the upper and lower retaining devices 15', 15" and 16', 16" correspond to one another, in order that the parallel positioning of the individual retaining devices 15', 15" and 16', 16" which is necessary for fastening on the top-hat rail is maintained. The need for parallel positioning means that the two retaining devices 15', 16' and 15", 16" of a retaining pair run parallel to one another, in order that they can engage around the upper and lower peripheries 2, 3 of the top-hat rail 1.

The fan 10 comprises an air-discharge grille 35, which is arranged on that side of the fan 10 which is directed away from the rear wall 11. The air flows through the air-discharge grille 35. The air-discharge grille 35 can be rotated about an axis which runs essentially parallel to the longitudinal axis of the fan 10. This allows the outflow direction of the air to be appropriately altered or adjusted.

As can also be seen to good effect in FIG. 7, the retaining devices 15', 16' and 15", 16" of a respective retaining pair, in the fastening state, are offset in relation to one another in the longitudinal direction of the top-hat rail. This arrangement of the retaining devices 15', 16' and 15", 16" corresponds to the arrangement explained in detail in FIGS. 1-5. The same applies to the distance b between the respective inner ends 17', 17" of the two upper retaining devices 15', 15" and the inner ends 18', 18" of the two lower retaining devices 16', 16". The distance d between the respectively associated inner ends 17', 18' and 17", 18" of a retaining pair is greater than the distance b between the upper periphery 2 and the lower periphery 3 of the top-hat rail 1 (not illustrated). The fan 10 can thus be inserted into the top-hat rail 1 by being tilted in a direction of tilting insertion k about a tilting axis Z perpendicular to the longitudinal direction X of the top-hat rail. As far as the position of the aforementioned axes and directions is concerned, reference is made to FIGS. 1-5.

Two locking catches 20', 20" are provided for securing the position of the fan 10 in the fastened state, said catches making it possible for the base plate 25 to be arrested in the respectively selected position. The locking catch 20' is in alignment with one of the two retaining pairs 17", 18" and with one of the two upper retaining devices 15". The further locking catch 20" is in alignment with the other retaining pair and with the correspondingly other upper retaining device 15'. The two locking catches 20', 20" each have a spring plate 20 which, upon insertion of the fan 10 into the top-hat rail 1, deflected and, in the retaining position of the fan 10, springs back into the rest position. The locking catch 20' or 20" here engages over the upper periphery 2 or lower periphery 3 of the top-hat rail 1. The fan 10 is thus arrested in the top-hat rail 1. For straightforward insertion, the two locking catches 20', 20" each have an oblique surface 21, along which the upper periphery 2 or lower periphery 3 of the top-hat rail 1 slides. The arresting operation takes place along the retaining surface 24, which is formed on the underside of the locking catch 20' or 20" and, in the fastened state, engages over the upper periphery 2 or lower periphery 3. An actuating plate 23 is provided for the purpose of releasing the locking catch 20', 20", said actuating plate extending beyond the housing or the base plate 25 and being laterally accessible. The spring plate 22 can be deflected by the actuating plate 23, and therefore the upper periphery 2 and lower periphery 3 are freed from the locking catch 20', 20" or the associated retaining surface 24. The fan can be released from the top-hat rail 1 by being tilted counter to the direction of tilting insertion k.

The spring plate 22 is part of the rear wall 11 of the base plate 25, wherein the spring function is achieved by the two parallel slots which separate part of the spring plate 22 from the rear wall 11. The slots run parallel to the retaining surface 24.

FIGS. 8A and 8B show schematic side views of different types of top-hat rails 1. The top-hat rail 1 may have different formats. In particular, two common formats or types of top-hat rails are used in switch-cabinet construction. The formats of top-hat rails differ in respect of the depth of the top-hat rail 1 and in respect of the thickness, i.e. of the diameter, of the material of the top-hat rail 1 itself. The top-hat rail 1 in FIG. 8A has a larger depth than the top-hat rail 1 in FIG. 8B (in FIGS. 8A and 8B, this is the extent of the top-hat rail 1 from left to right). The material of the top-hat rail 1 in FIG. 8B has a smaller diameter, i.e. a smaller thickness, than that of the top-hat rail 1 in FIG. 8A.

Depending on the format or the type of top-hat rail 1 on which the fan 10 is to be fastened or fastenable, the retaining devices 15, 16, and in particular the bevels 19, 19', are designed correspondingly. Since, in particular, two formats of top-hat rail are standard in switch-cabinet construction, the retaining devices 15, 16 and/or the bevels 19, 19' of the fan 10 are designed or adapted in accordance with the format or type of top-hat rail 1 on which the fan 10 is to be fastened or fastenable.

LIST OF DESIGNATIONS

| | |
|---|---|
| 1 | Top-hat rail |
| 2 | Upper periphery |
| 3 | Lower periphery |
| 10 | Apparatus/body |
| 11 | Rear wall |
| 12 | Upper side |
| 13 | Left-hand side |
| 13' | Right-hand side |
| 14 | Underside |
| 15 | Upper retaining device |
| 16 | Lower retaining device |
| 17 | Inner end, top |
| 18 | Inner end, bottom |
| 19, 19' | Bevel |
| 20', 20" | Locking catch |
| 21 | Oblique surface |
| 22 | Spring plate |
| 23 | Actuating plate |
| 24 | Retaining surface |
| 25 | Base plate |
| 26 | Fastening device |
| 27 | Nozzle |
| 30 | Air slot |
| 35 | Air-discharge grille |
| X | Longitudinal direction |
| d | Distance between inner ends |
| b | Width of top-hat rail |
| Z | Tilting axis |
| k | Direction of tilting |

The invention claimed is:

1. A fan for insertion into a top-hat rail, the fan being in a fastened state when the fan has been inserted into the top-hat rail, the fan comprising:
 a base plate comprising a rear wall;
 a nozzle fastened to the base plate; and
 a fastening device disposed on the rear wall, the fastening device comprising a first upper retaining device, a second upper retaining device, a first lower retaining device, and a second lower retaining device;
 wherein in the fastened state of the fan, the first upper retaining device engages around an upper periphery of the top-hat rail;
 wherein, in the fastened state of the fan, the first lower retaining device engages around a lower periphery of the top-hat rail;
 wherein, in the fastened state of the fan, the first upper retaining device and the first lower retaining device are offset in relation to one another in a longitudinal direction parallel to a longitudinal axis of the top-hat rail;
 wherein, each upper retaining device comprises an upper inner end, the respective upper inner end defines a side of the respective upper retaining device;
 wherein each lower retaining device comprises a lower inner end, the respective lower inner end defines a side of the respective lower retaining device;
 wherein, in the fastened state of the fan, the upper inner end and the lower inner end are directed toward each other along the longitudinal direction and are spaced apart by a first distance, the first distance being greater than a second distance between the upper periphery and a lower periphery to increase an angle of rotation through which the fan is insertable;
 wherein the first distance permits the fan to be inserted into the top-hat rail by being tilted in a tilting direction about a tilting axis perpendicular to the longitudinal axis of the top-hat rail to place the fan in a fastened state; and
 wherein each of the upper retaining devices and each of the lower retaining devices are respectively oriented to each other at 90 degrees and are arranged directly next to each other to form one continuous piece.

2. The fan of claim 1, wherein each upper retaining device comprises a first bevel and each lower retaining device comprises a second bevel, the first bevel and the second bevel being directed toward each other, the first bevel and the second bevel for reducing a tilting angle necessary for inserting the fan into the top rail.

3. The fan of claim 2, wherein each of the upper retaining device and the lower retaining device comprise
 a material thickness adapted to a material thickness of the top-hat rail or
 a depth similar to a depth of the top-hat rail.

4. The fan of claim 1, wherein each upper retaining device and each lower retaining device are rotationally symmetrical about the tilting axis.

5. The fan of claim 1, wherein at least one upper retaining device and at least one lower retaining device are unitary with the rear wall.

6. The fan of claim 1,
 wherein the second upper retaining device is substantially similar to the first upper retaining device and the second lower retaining device is substantially similar to the first lower retaining device;
 wherein the second upper retaining device and the second lower retaining device are disposed on the rear wall to interact as a pair to fasten the fan to the top-hat rail;
 wherein the second upper retaining device and the second lower retaining device are oriented differently on the rear wall from the first upper retaining device and the first lower retaining device;
 wherein the second upper retaining device and the second lower retaining device for installing in a different position than a position the first upper retaining device and the first lower retaining device.

7. The fan of claim 6, further comprising a one-dimensional pivoting element for pivoting the fan about a pivot axis.

8. The fan of claim 7, wherein the fan can be installed in such a position that the pivot axis is perpendicular or parallel to the longitudinal direction.

9. The fan of claim 1, further comprising a locking catch for locking the fan in the fastened state.

10. The fan of claim 9, wherein the locking catch can be unlocked by tilting the fan in the tilting direction.

11. The fan of claim 1, wherein the side of the respective upper retaining device and the side of the respective lower retaining device do not abut the top-hat rail.

12. A combination comprising:
 a fan for insertion and a top-hat rail, the fan being in a fastened state when the fan has been inserted into the top-hat rail, the fan comprising
 a base plate comprising a rear wall;
 a nozzle fastened to the base plate; and
 a fastening device disposed on the rear wall, the fastening device comprising a first upper retaining device, a second upper retaining device, a first lower retaining device, and a second lower retaining device;
 wherein in the fastened state of the fan, the first upper retaining device engages around an upper periphery of the top-hat rail;

wherein, in the fastened state of the fan, the first lower retaining device engages around a lower periphery of the top-hat rail;

wherein, in the fastened state of the fan, the first upper retaining device and the first lower retaining device are offset in relation to one another in a longitudinal direction parallel to a longitudinal axis of the top-hat rail;

wherein each upper retaining device comprises an upper inner end, the upper inner end defines a side of the respective upper retaining device;

wherein each lower retaining device comprises a lower inner end, the lower inner end defines a side of the respective lower retaining device;

wherein, in the fastened state of the fan, the upper inner end and the lower inner end are directed toward each other along the longitudinal direction and are spaced apart by a first distance, the first distance being greater than a second distance between the upper periphery and a lower periphery to increase an angle of rotation through which the fan is insertable;

wherein the first distance permits the fan to be inserted into the top-hat rail by being tilted in a tilting direction about a tilting axis perpendicular to the longitudinal axis of the top-hat rail to place the fan in a fastened state, and wherein each of the upper retaining devices and each of the lower retaining devices are respectively oriented to each other at 90 degrees and are arranged directly next to each other to form one continuous piece.

13. The fan of claim 12, wherein at least one upper retaining device comprises a first bevel and at least one lower retaining device comprises a second bevel, the first bevel and the second bevel being directed toward each other, the first bevel and the second bevel for reducing a tilting angle necessary for inserting the fan into the top rail.

14. The fan of claim 12, wherein each upper retaining device and each lower retaining device are rotationally symmetrical about the tilting axis.

15. The fan of claim 12, wherein at least one upper retaining device and at least one lower retaining device are unitary with the rear wall.

16. The fan of claim 12,
wherein the second upper retaining device being substantially similar to the first upper retaining device and the second lower retaining device is substantially similar to the first lower retaining device;

wherein the second upper retaining device and the second lower retaining device are disposed on the rear wall to interact as a pair to fasten the fan to the top-hat rail;

wherein the second upper retaining device and the second lower retaining device are oriented differently on the rear wall from the first upper retaining device and the first lower retaining device;

wherein the second upper retaining device and the second lower retaining device for installing in a different position than a position the first upper retaining device and the first lower retaining device.

17. The fan of claim 16, further comprising a one-dimensional pivoting element for pivoting the fan about a pivot axis.

18. The fan of claim 17, wherein the fan can be installed in such a position that the pivot axis is perpendicular or parallel to the longitudinal direction.

19. The fan of claim 12, further comprising a locking catch for locking the fan in the fastened state.

20. The fan of claim 12, wherein the side of the respective upper retaining device and the side of the respective lower retaining device do not abut the top-hat rail.

* * * * *